(12) United States Patent
Xu et al.

(10) Patent No.: US 11,871,528 B1
(45) Date of Patent: Jan. 9, 2024

(54) LED DISPLAY

(71) Applicant: SHENZHEN ONLY CO., LTD, Shenzhen (CN)

(72) Inventors: Guanghua Xu, Shenzhen (CN); Ping Guo, Jingzhou (CN)

(73) Assignee: SHENZHEN ONLY CO., LTD, Shenzhen (CN)

( * ) Notice: Subject to any disclaimer, the term of this patent is extended or adjusted under 35 U.S.C. 154(b) by 0 days.

(21) Appl. No.: 17/966,874

(22) Filed: Oct. 16, 2022

(30) Foreign Application Priority Data

Jul. 28, 2022 (CN) .......................... 202210899728.7

(51) Int. Cl.
*H05K 5/00* (2006.01)
*H05K 5/02* (2006.01)

(52) U.S. Cl.
CPC ......... *H05K 5/0217* (2013.01); *H05K 5/0247* (2013.01)

(58) Field of Classification Search
CPC ... H05K 5/0017; H05K 5/0217; H05K 5/0247
USPC ....... 361/807, 728, 730, 752, 796, 800, 809, 361/810
See application file for complete search history.

(56) References Cited

U.S. PATENT DOCUMENTS

2004/0156168 A1* 8/2004 LeVasseur ............ G06F 3/0414
361/679.21
2016/0306394 A1* 10/2016 Kuo ....................... G06F 1/1626

FOREIGN PATENT DOCUMENTS

| CN | 202282123 | * | 6/2012 | ............... H05K 5/06 |
| CN | 203055365 | * | 7/2013 | ............... H05K 7/20 |
| CN | 103280164 | * | 9/2013 | ............... G09F 9/33 |
| CN | 102402911 | * | 3/2018 | ............... G09F 9/33 |
| CN | 209947331 | * | 7/2019 | ............... G09F 9/33 |
| CN | 210429161 | * | 4/2020 | ............... H05K 7/20 |

* cited by examiner

*Primary Examiner* — Hung S. Bui

(57) ABSTRACT

An LED display, includes a mounting frame, at least one LED display panel and at least one separate power control box, with the LED display panel connected to the mounting frame, the separate power control box electrically connected to the LED display panel. The mounting frame includes transverse rods, longitudinal rods, and a connection block with two connection surfaces, with an 90° angle between the surfaces, two transvers rods and two longitudinal rods head-tail connected, one connection surface connected to the transverse rods, and the other connected to the longitudinal rods. A support pole is provided between two transverse rods along a length direction, with a support column on the support pole and extending from back to front, with a first control box connection hole on above of the support column. The display can meet requirement of easily stitching multiple LED display panels and achieving an ease usage.

11 Claims, 13 Drawing Sheets

LED DISPLAY

TECHNICAL FIELD

The present disclosure relates to a field of LED display technology, and in particular to an LED display.

BACKGROUND

LED displays are flat panel displays, consisting of multiple small LED modular panels, and configured to display various information such as text, images, video, etc. An LED electronic display integrates microelectronics technology, computer technology, and information processing technic, possessing advantages of bright colors, wide dynamic range, high brightness, long life, as well as a stable and reliable working performance, etc. LED displays are widely used in cases of commercial media, cultural performance markets, stadiums, information dissemination, press releasing, securities trading, and can meet different requirements of different environments. LED displays consist of LED display panels and mounting frames, and existing LED display panels have a comparatively large thickness, which affects usage in limited spaces.

SUMMARY

In view of the above-mentioned shortcomings and deficiencies of related arts, the present disclosure provides an LED display to solve the technical problem of the large thickness of the LED display panel caused by the incompact inner structure of the LED display panel in related arts.

To achieve the aforementioned and other objectives, some of the main technical solutions in the present disclosure are as follows.

According to one aspect of the disclosure, an LED display is provided, including a mounting frame and an LED display panel mounted on a front side surface of the mounting frame. The LED display panel includes a casing, an installation support, an LED lamp panel, a waterproof adhesive layer and a lamp panel mask arranged in sequence from back to front. A receiving slot is formed in a front part of the casing, for receiving the installation support, the LED lamp panel, the waterproof adhesive layer and the lamp panel mask. A rear side surface of the installation support is attached to a front side surface of the casing, and a front side surface of the installation support is attached to a rear side surface of the LED lamp panel. A rear side surface of the waterproof adhesive layer is attached to a front side surface of the LED lamp panel, and a front side surface of the waterproof adhesive layer is attached to a rear side surface of the lamp panel mask. According to another aspect of the disclosure, the mounting frame includes first transversal support rods extending transversely, first longitudinal support rods extending longitudinally and a connection block. The connection block includes two connection surfaces, with an angle of 90° between the two connection surfaces. Two said first transversal support rods and two said first longitudinal support rods are head-tail connected, one connection surface of the connection block is connected to the first transversal support rods, and the other connection surface of the connection block is connected to the first longitudinal support rods, with at least one support pole provided between the two said first transversal support rods and extending along a length direction, the support pole including two first control box connection holes.

According to another aspect of the disclosure, the LED display includes at least two protection doors on the first transversal support rods, the protection doors are configured on two opposite sides of the support pole, the protection doors including a plurality of heat dissipation holes and further including locking parts at four corners, the first transversal support rods including a connection part, the locking part matching with the connection part.

According to another aspect of the disclosure, the LED display further includes a separate power control box. The separate power control box is electrically connected to the LED display panel and connected to the mounting frame. The separate power control box includes a control box body, a heat dissipation window, a connection slot and a cover plate. The control box body contains a power supply and a control card, the power supply and the control card are electrically connected to the LED display panel; the cover plate is detachably connected to a front side surface of the control box body, the heat dissipation window is configured on a rear side surface of the control box body, the heat dissipation window is in correspondence with the power supply, the connection slot is configured in a middle of the rear side surface of the control box body along the length direction, the connection slot is configured along a height direction of the control box body, and the control box body includes a first connection hole on the top, with the first connection hole in correspondence with the connection slot.

According to another aspect of the disclosure, the connection slot matches with the support rod, a projection is formed at a bottom of the control box body, with a second connection hole formed at a bottom of the projection, and the second connection hole and the first connection hole are respectively bolted to the two first control box connection holes.

According to another aspect of the disclosure, wherein, the mounting frame includes transversal support rods configured transversely, longitudinal support rods longitudinally configured and an L-shaped connection plate. Two said transversal support rods and two said longitudinal support rods are head-tail connected via the L-shaped connection plate, with the L-shaped connection plate placed outside of the transversal support rods and the longitudinal support rods.

According to another aspect of the disclosure, the LED display further includes an adapter plate provided on the rear side surface of the casing, with the adapter plate being electrically connected to the LED lamp panel and a separate power control box. The receiving slot includes a fourth stepped part which is formed in a middle of a front side of the casing along a length direction, and extends along a height direction of the casing. A first stepped part is provided on two opposite sides of the fourth stepped part, a third stepped part is provide at edges around the front side of the casing, and a second stepped part is provided on a side of the third stepped part adjacent to the first stepped part, along the edges around the casing, with both the second stepped part and the third stepped part configured around two said first stepped parts and the second stepped part being separated by the fourth stepped part. A front side surface of the first stepped part, a front side surface of the second stepped part, a front side surface of the fourth stepped part and a front side surface of the third stepped part are configured in sequence from back to front.

According to another aspect of the disclosure, a plurality of the installation supports are connected to the first stepped part, the rear side surface of the installation supports is attached to the front side surface of the first stepped part, the front side surface of the installation supports is coplanar with the front side surface of the second stepped part, and the rear side surface of a plurality of the LED lamp panels is connected to the front side surface of the second stepped part; the front side surface of the LED lamp panel is coplanar with the front side surface of the fourth stepped part; the rear side surface of the lamp panel mask is connected to the front side surface of the third stepped part; and the waterproof adhesive layer is provided on the fourth stepped part and the plurality of LED lamp panels, with the rear side surface of the waterproof adhesive layer connected to the front side surface of the LED lamp panel and the front side surface of the fourth stepped part, and the front side surface of the waterproof adhesive layer connected to the rear side surface of the lamp panel mask.

According to another aspect of the disclosure, a quantity ratio of the LED lamp panel, the installation support and the lamp panel mask is 1:2:4.

According to another aspect of the disclosure, the installation support is grid-structured, including a number of horizontally extending support crossbars (51) and a number of vertically extending support longitudinal bars; the support crossbars are evenly spaced in a height direction of the support longitudinal bars, and the support longitudinal bars are evenly spaced in a length direction of the support crossbars. A plurality of installation supports are configured in a laterally symmetrical manner with respect to the LED lamp panel.

The present disclosure may achieve at least following advantages.

Firstly, the LED display of the present disclosure is a combination of at least the LED display panel and the mounting frame, and the LED display panel and mounting frame can be packaged and transported separately during transportation, thus achieving a convenient transportation.

Secondly, it is easy to adopt the mounting frame of the present disclosure to combine and assemble multiple LED display panels when necessary, obtaining easy usage.

Thirdly, with the configuration of four stepped surfaces in present disclosure, the casing, the installation support, the LED lamp panel, the waterproof adhesive layer and the lamp panel mask are closely attached sequentially, so that there is small gaps or even no gaps between each other, so as to reduce the thickness of the LED display panel.

Further, the installation support of the present disclosure is grid-structured, different spacing of adjacent crossbars can be suitable for installation of LED lamp panels with different lamp pitches, and thus the LED lamp panels of diffident specifications can be installed on a same installation support.

Figure 1:
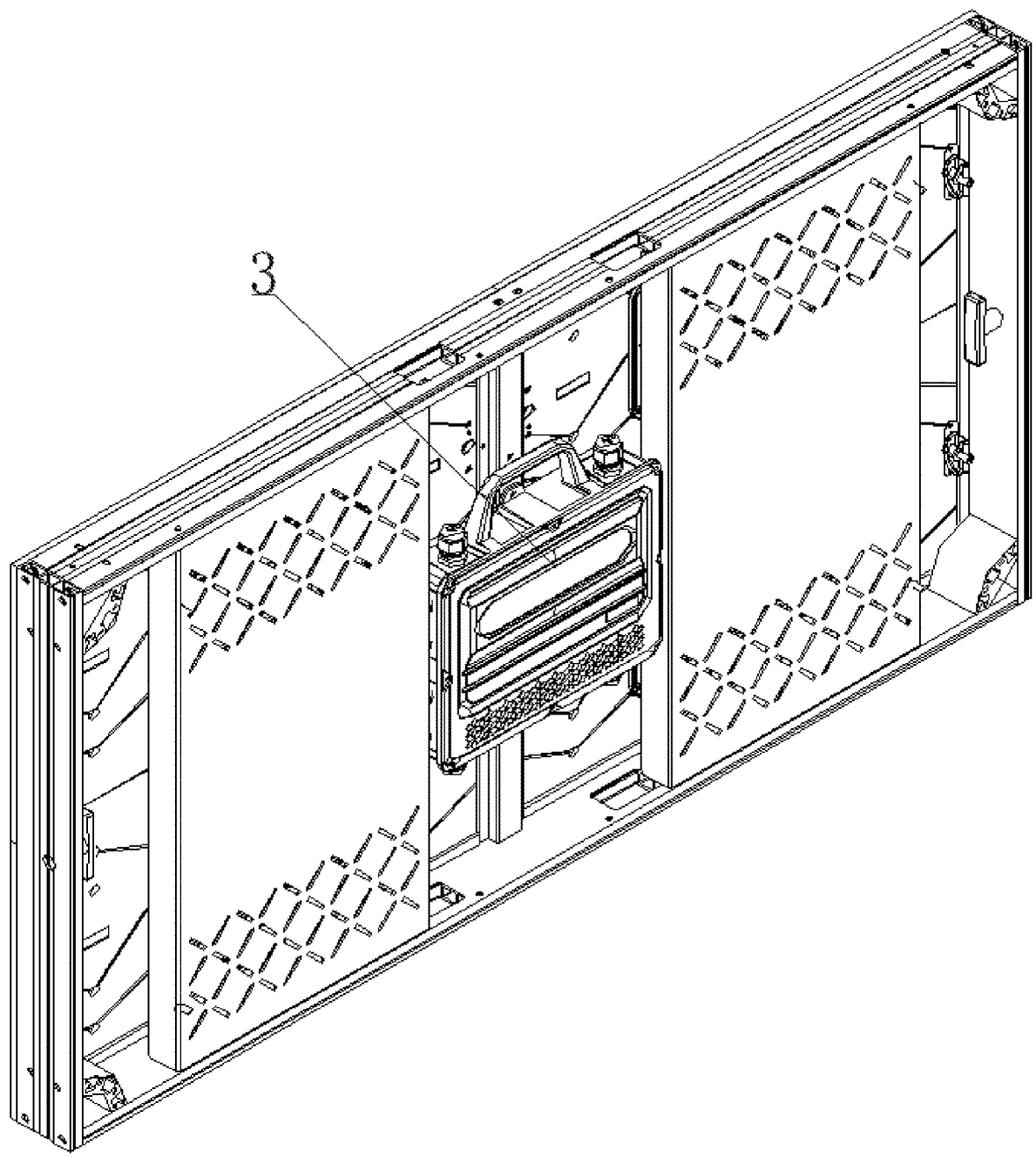
FIG. 1 is a schematic diagram illustrating an overall structure of an LED display of a first embodiment.
Figure 2:
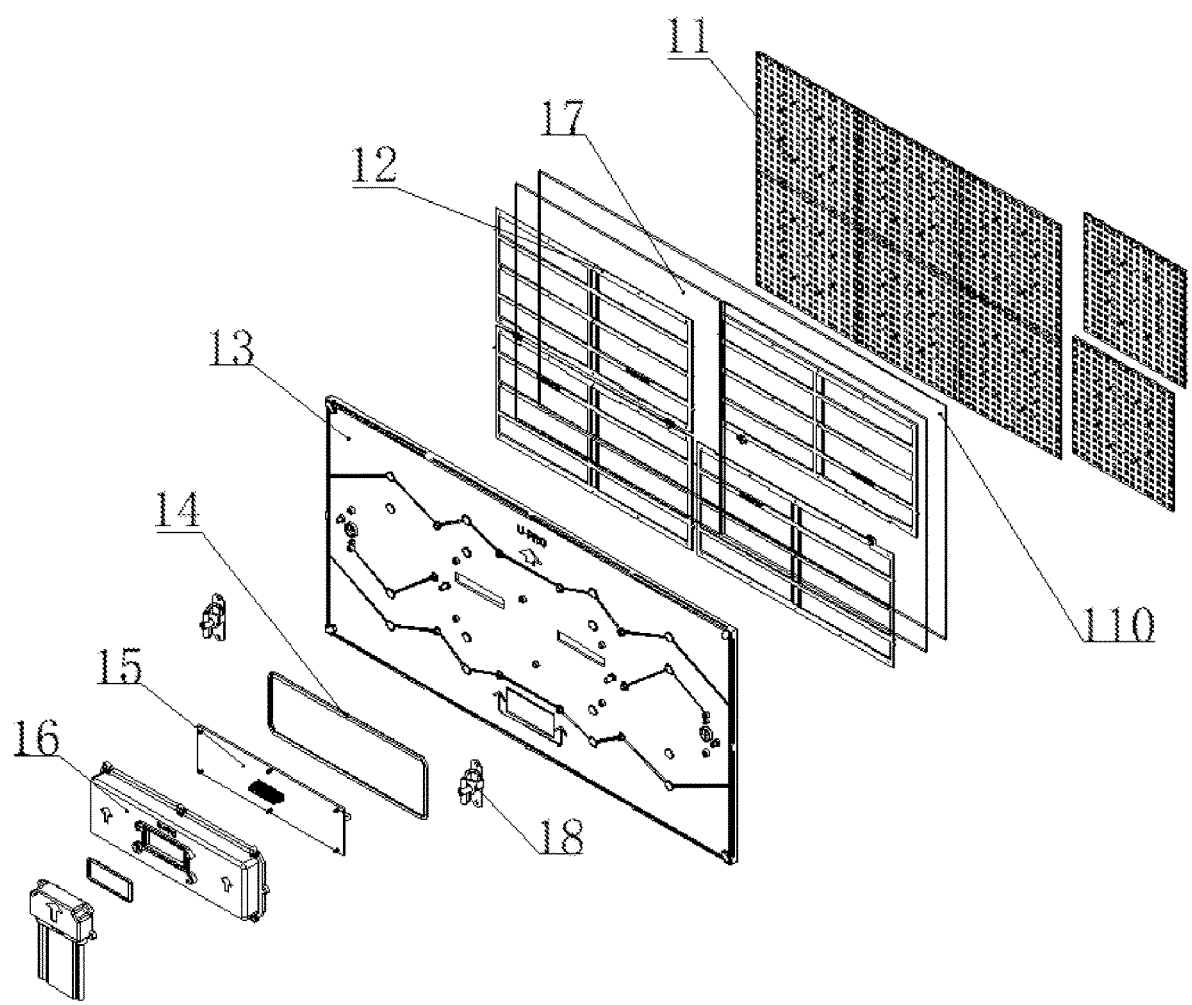
FIG. 2 illustrates an exploded view of an LED display panel in the present disclosure.
Figure 3:
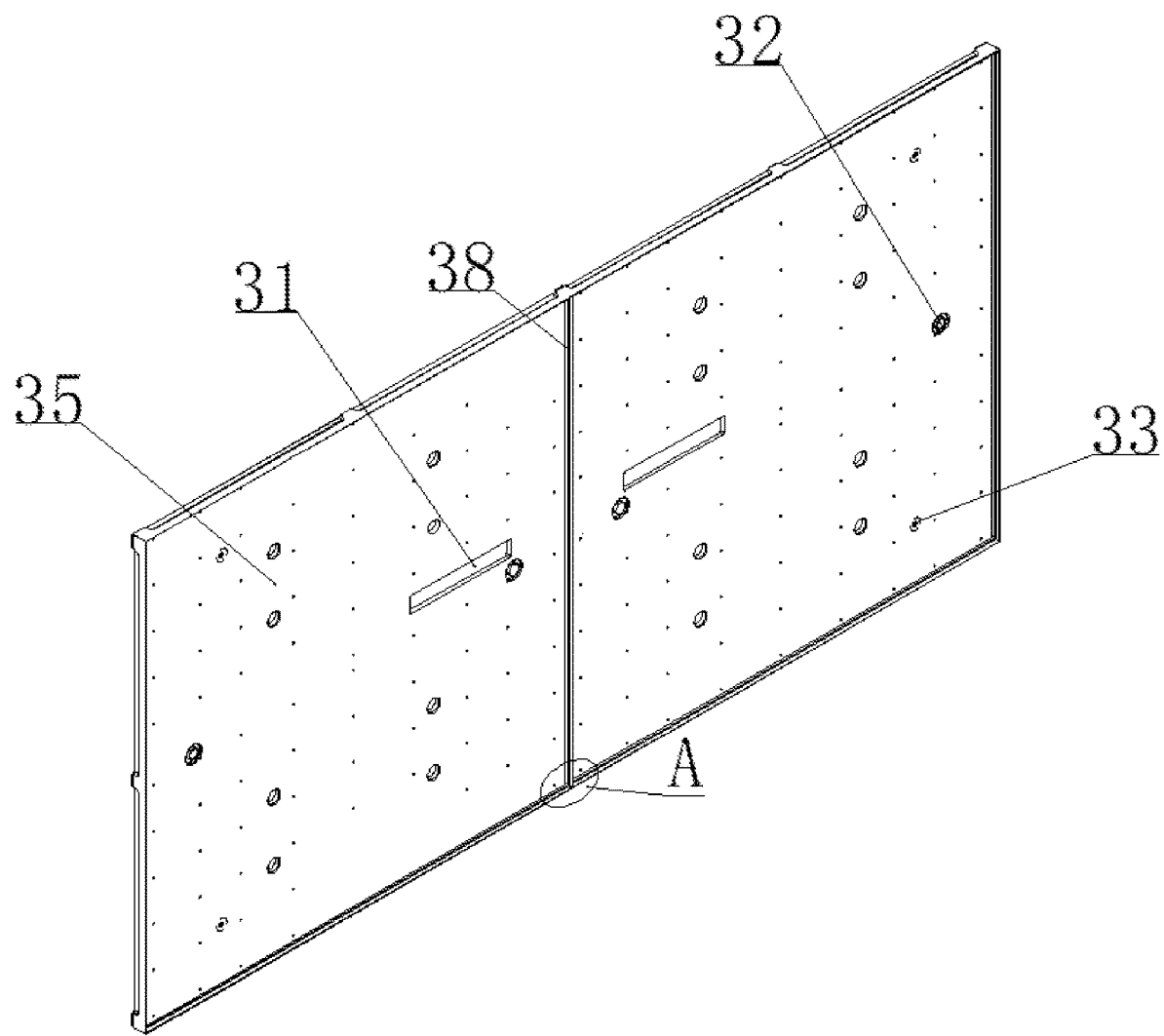
FIG. 3 is a schematic diagram illustrating a structure of a casing in the present disclosure.
Figure 4:
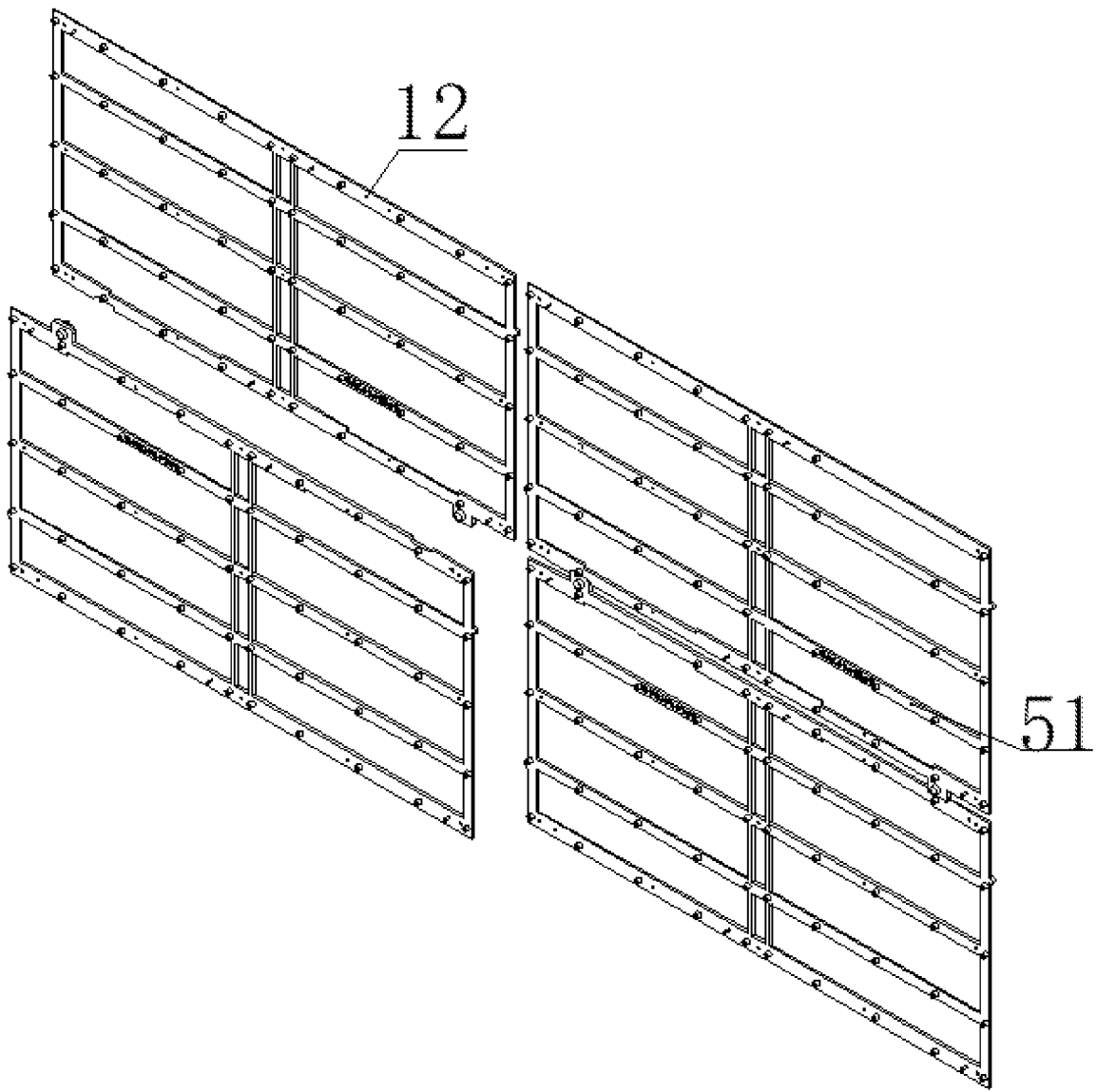
FIG. 4 shows a schematic diagram illustrating a structure of the installation support in the first embodiment.
Figure 5:
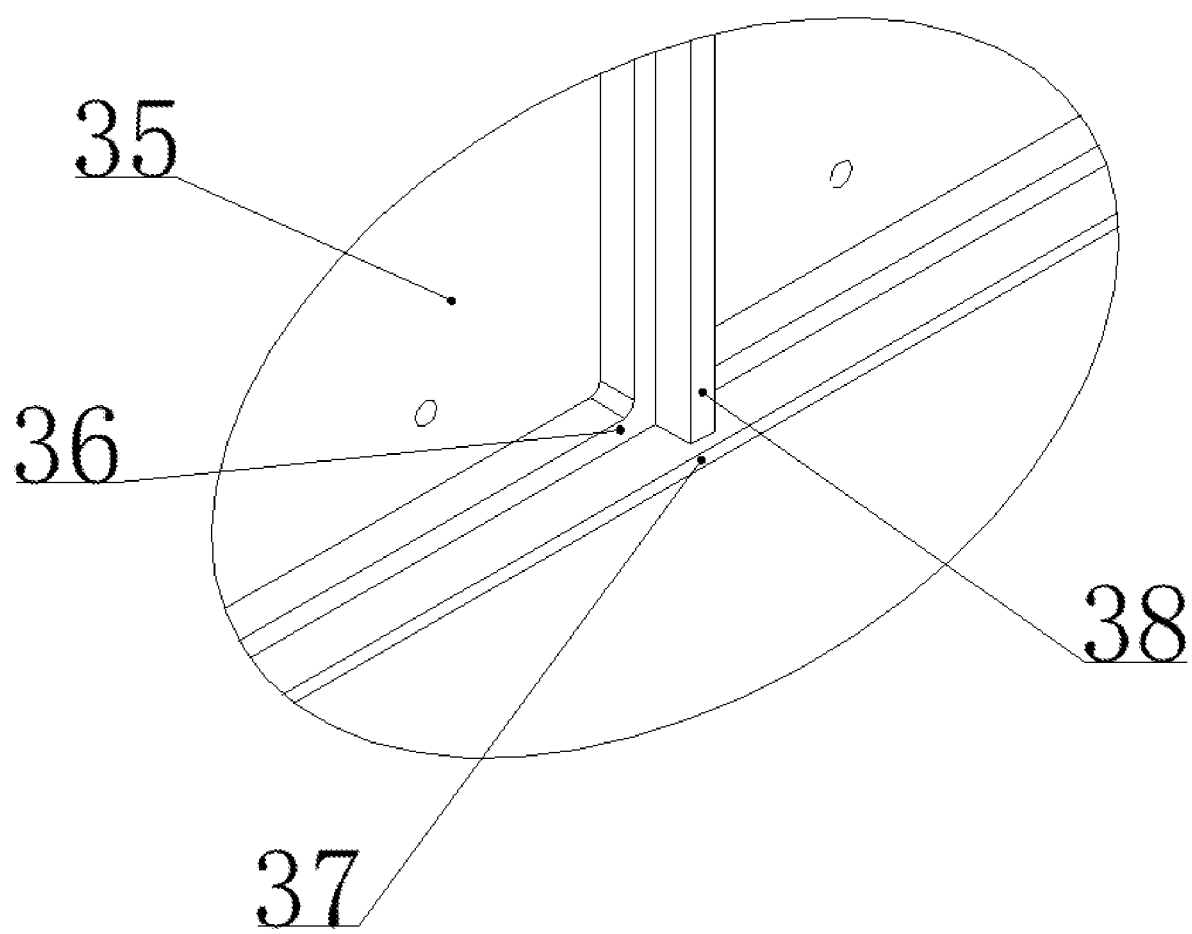
FIG. 5 illustrates an enlarged schematic view of part A in FIG. 3.

Reference numbers shown in the drawings are as follows. Reference number 1 denotes an LED display panel, reference number 3 denotes a separate power control box, reference number 11 denotes a lamp panel mask, reference number 12 denotes an installation support, reference number 13 denotes a casing, reference number 14 denotes a first sealing ring, reference number 15 denotes an adapter plate, reference number 16 denotes an adapter box, reference number 17 denotes a LED lamp panel, reference number 18 denotes a connection lock, reference number 110 denotes a waterproof adhesive layer, reference number 21 denotes an L-shaped connection plate, reference number 22 denotes a transversal support rod, reference number 23 denotes a longitudinal support rod, reference number 31 denotes a insertion slot, reference number 32 denotes a first lock hole, reference number 33 denotes a threaded through hole, reference number 35 denotes a first stepped part, reference number 36 denotes a second stepped part, reference number 37 denotes a third stepped part, reference number 38 denotes a fourth stepped part, reference number 41 denotes a first transversal support rod, reference number 42 denotes a lead-through hole, reference number 43 denotes a first longitudinal support rod, reference number 44 denotes a support pole, reference number 45 denotes a connection block, reference number 47 denotes a protection door, reference number 410 denotes a first control box connection hole, reference number 411 denotes a connection part, reference number 412 denotes a second connection part, reference number 51 denotes a support crossbar, reference number 61 denotes an insertion pillar, reference number 62 denotes a sliding seat, reference number 63 denotes a pull-up spring, reference number 64 denotes a locking seat, reference number 65 denotes a push-pull handle, reference number 66 denotes a sliding slot, reference number 71 denotes a control box body, reference number 72 denotes a signal output interface, reference number 73 denotes a cover plate, reference number 74 denotes a waterproof power connector, reference number 75 denotes a second connection hole, reference number 79 denotes a first connection hole, reference number 710 denotes a connection slot, and reference number 711 denotes a heat dissipation window.

DETAILED DESCRIPTION OF EMBODIMENTS

In order to better explain the present disclosure and make the present disclosure more understandable, specific embodiments are described below in conjunction with drawings to make a detailed description of the present disclosure. Herein, with reference to FIG. 1, the side adjacent to an LED display panel 1 is referred as a term "front side", and the side adjacent to a separate power control box 3 is referred as a term "rear side", and the term "width direction" (or from back to forth) mentioned in the disclosure refers to a thickness direction of the LED display.

Embodiments are described below.

As shown in FIG. 1, an LED display includes a mounting frame and an LED display panel 1 mounted on a front side of the mounting frame.

The LED display panel 1 includes a casing 13, an installation support 12, an LED lamp panel 17, a waterproof adhesive layer 110 and a lamp panel mask 11, arranged in sequence from back to front.

A receiving slot is defined in a front part of the casing 13, for receiving the installation support 12, the LED lamp panel 17, the waterproof adhesive layer 110 and the lamp panel mask 11.

The installation support 12 has a rear side surface attached to a front side surface of the casing 13, and a front side surface of the installation support 12 is attached to a rear side surface of the LED lamp panel 17.

The waterproof adhesive layer 110 has a rear side surface attached to a front side surface of the LED lamp panel 17, and a front side surface of the waterproof adhesive layer 110 is attached to a rear side surface of the lamp panel mask 11.

With the casing 13, the installation support 12, the LED lamp panel 17, the waterproof adhesive layer 110 and the lamp panel mask 11 attached sequentially, it is possible that the LED display panel 1 may achieve a more compact structure and a smaller thickness.

The LED display panel 1 includes a plurality of quick connection locks 18 in the middle thereof along a height direction on the rear side surface, and the mounting frame includes a plurality of quick connection holes, with the quick connection locks matching the quick connection holes.

Figure 6:
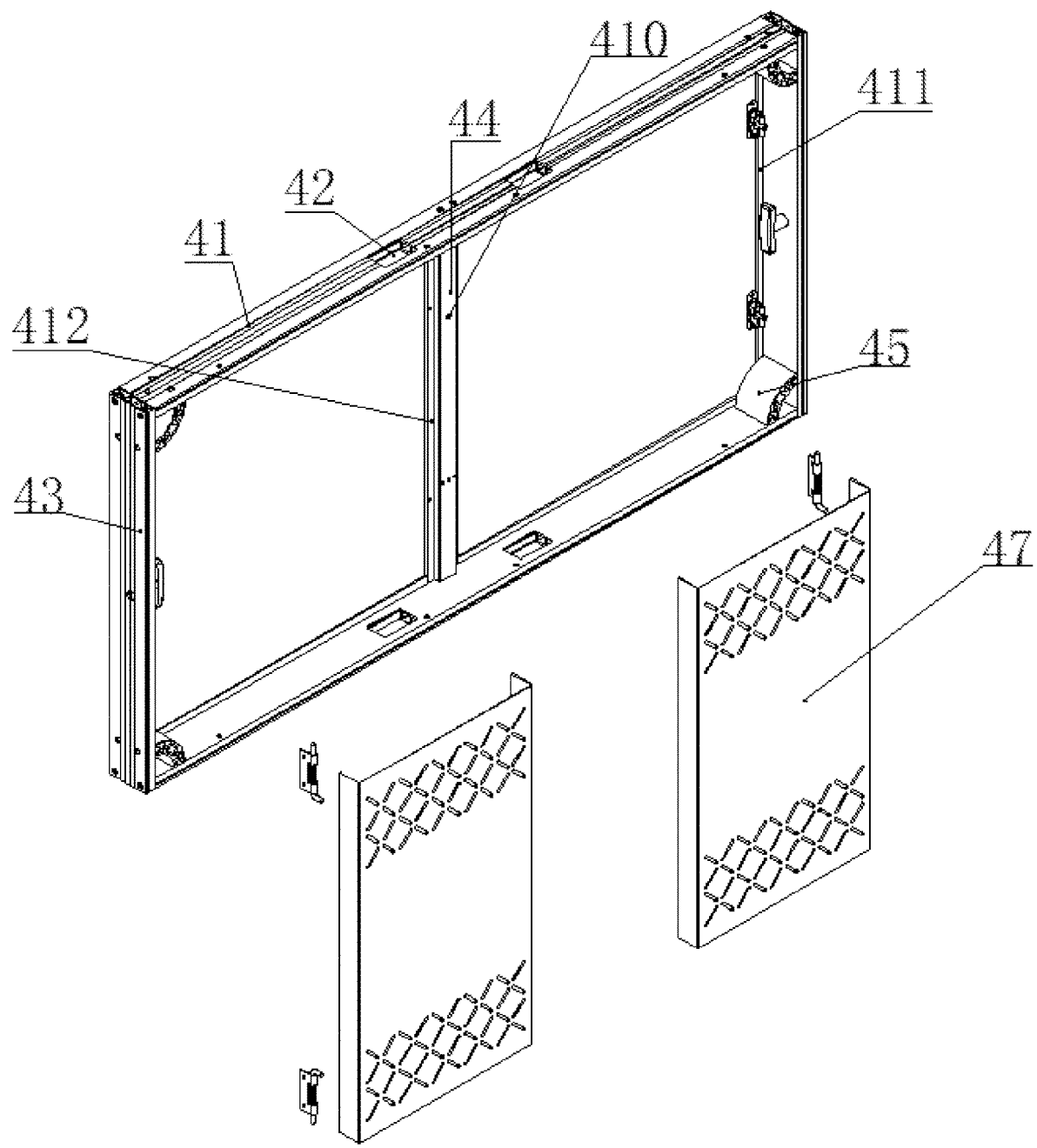
FIG. 6 illustrates an exploded view of the mounting frame in the first embodiment.
Figure 7:
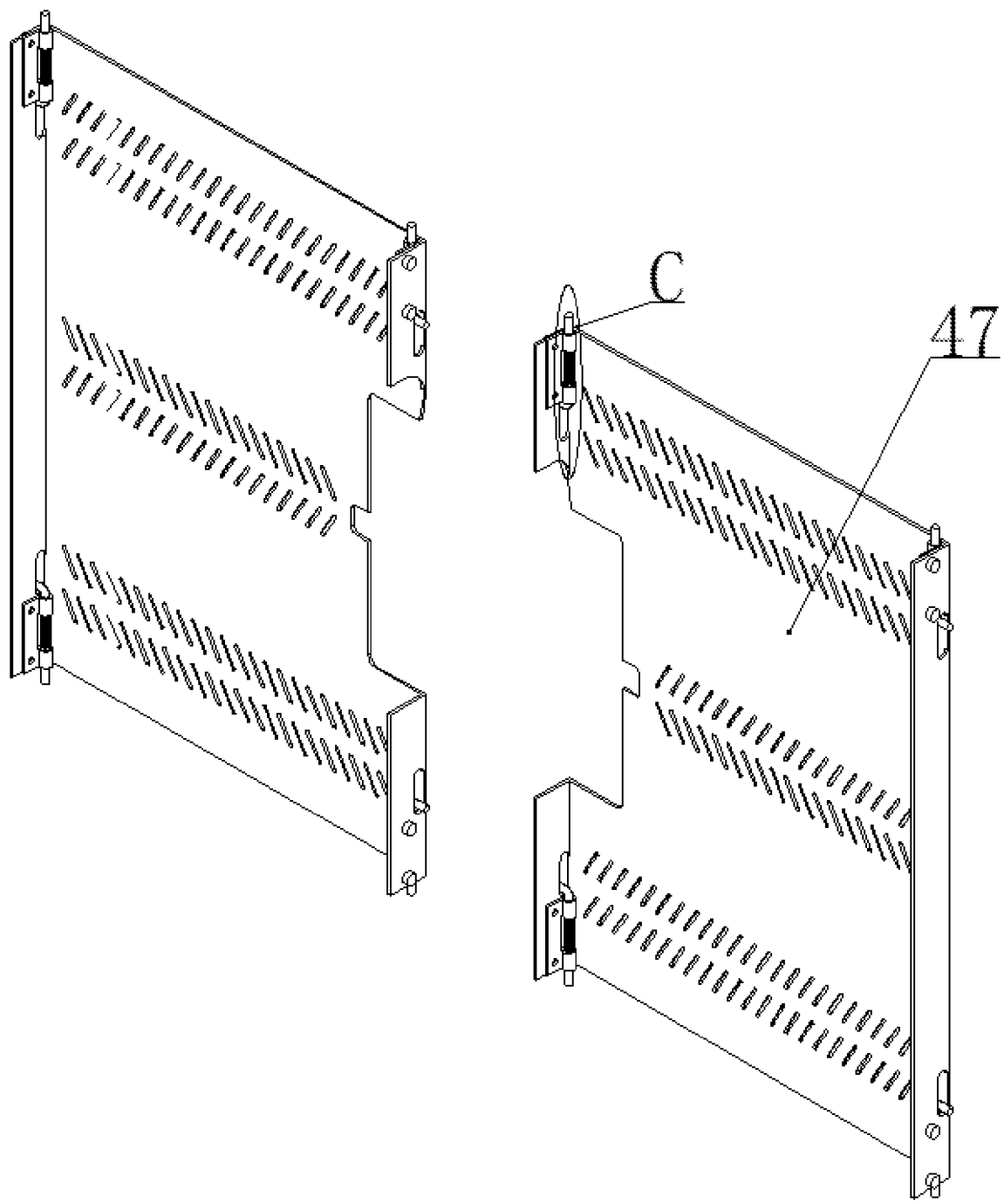
FIG. 7 illustrates a schematic diagram of the structure of the protection door in the present disclosure.

As shown in FIGS. 6-7, the mounting frame includes first transversal support rods 41 extending transversely, first longitudinal support rods 43 extending longitudinally, and a connection block 45. Herein, the connection block 45 is configured on an inner side of the first transversal support rod 41 and the first longitudinal support rod 43. The connection block 45 includes two connection surfaces, and an angle between the two connection surfaces is 90°. Two first transversal support rods 41 and two first longitudinal support rods 43 are head-tail connected, one connection surface of the connection block 45 is fixedly connected to the first transversal support rod 41, and the other connection surface of the same connection block 45 is fixedly connected to the first longitudinal support rod 43. A support pole 44 is fixedly connected to the meddle of two first transversal support rods 41, along a length direction of the transversal support rod, and the support pole 44 includes two first control box connection holes 410. A connection slot 710 shown in FIG. 9 matches with the support pole 44. The control box body 71 is provided with a projection at the bottom, with a second connection hole 75 formed at the bottom of the projection. A first connection hole 79 on top of control box body and the second connection hole 75 are bolted to the two first control box connection holes 410 respectively.

The first transversal support rod 41 includes a leadthrough hole 42, through which wires can pass to facilitate wire collection and arrangement.

Figure 8:
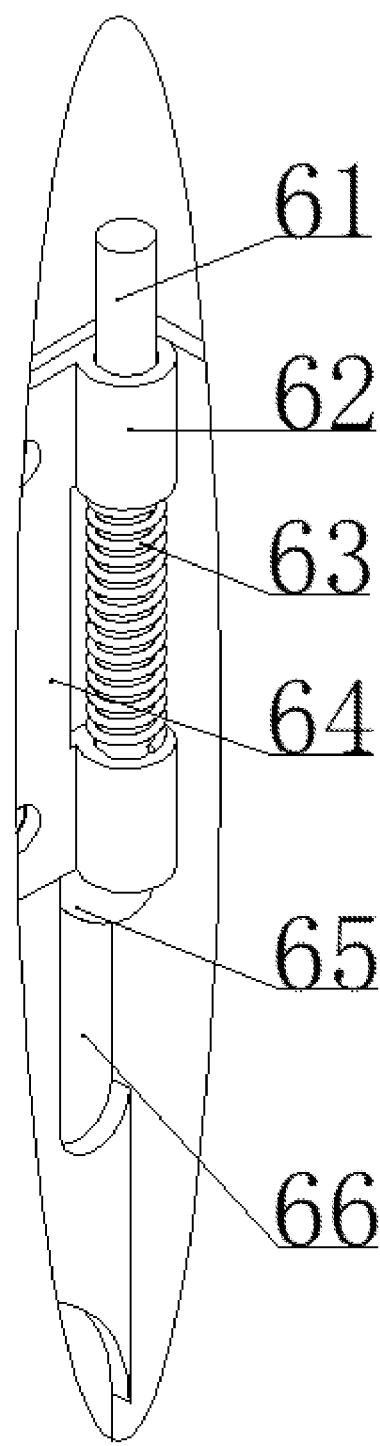
FIG. 8 illustrates an enlarged schematic view of part C in FIG. 8.

As shown in FIGS. 6-8, two protection doors 47 are provided between the two first transversal support rods 41, and the two protection doors 47 are separately placed on two sides of the support pole 44, and the protection doors 47 include a plurality of heat dissipation holes. Four corners of the protection door 47 all include a locking part, the first transversal support rod 41 has a connection part, and the locking part matches with the connection part. In order to avoid interferences of the protection door 47 to dismounting of the separate power control box 3, the two protection doors 47 both include a recess adjacent to the side of the support pole 44, and the recess matches with the separate power control box 3.

As an example, the connection part includes an insertion hole.

As shown in FIG. 8, the locking part includes a locking seat 64, which is connected to the protection door 47. The protection door 47 has a sliding slot 66, which is formed on a side of the locking seat 64 away from the first transversal support rod 41. Both upper and lower ends of the locking seat 64 are provided with a sliding seat 62. The sliding seat 62 includes a sliding hole. The sliding hole is provided with an insertion pillar 61, with a push-pull handle 65 formed at an end of the insertion pillar 61 adjacent to the sliding slot 66. An end of the push-pull handle 65 away from the insertion pillar extends out of the sliding slot 66, and the push-pull handle 65 is slidable in the sliding slot 66 in a longitudinal direction. The insertion pillar 61 is sheathed by a pull-up spring 63, which is placed between two sliding seats 62. The pull-up spring 63 is fixedly connected to the sliding seat 62 at an end away from the sliding slot 66, while an end of the pull-up spring 63 adjacent to the sliding slot is fixedly connected to the insertion pillar 61. When the pull-up spring 63 is in a relaxed state, the insertion pillar 61 is inserted into the insertion hole, and the insertion pillar 61 is rotatable in the insertion hole. With the locking part getting coupled to the connection part, and the protection door 47 can be fixed. When the locking part on a side of the protection door 47 is separated from the connection part, i.e., the push-pull handle 65 get pulled to slide in the sliding slot 66 and then the insertion pillar 61 can be moved away from the connection part, the door 47 can be rotated and get opened to facilitate dismounting from the rear side of the LED display panel 1.

Figure 9:
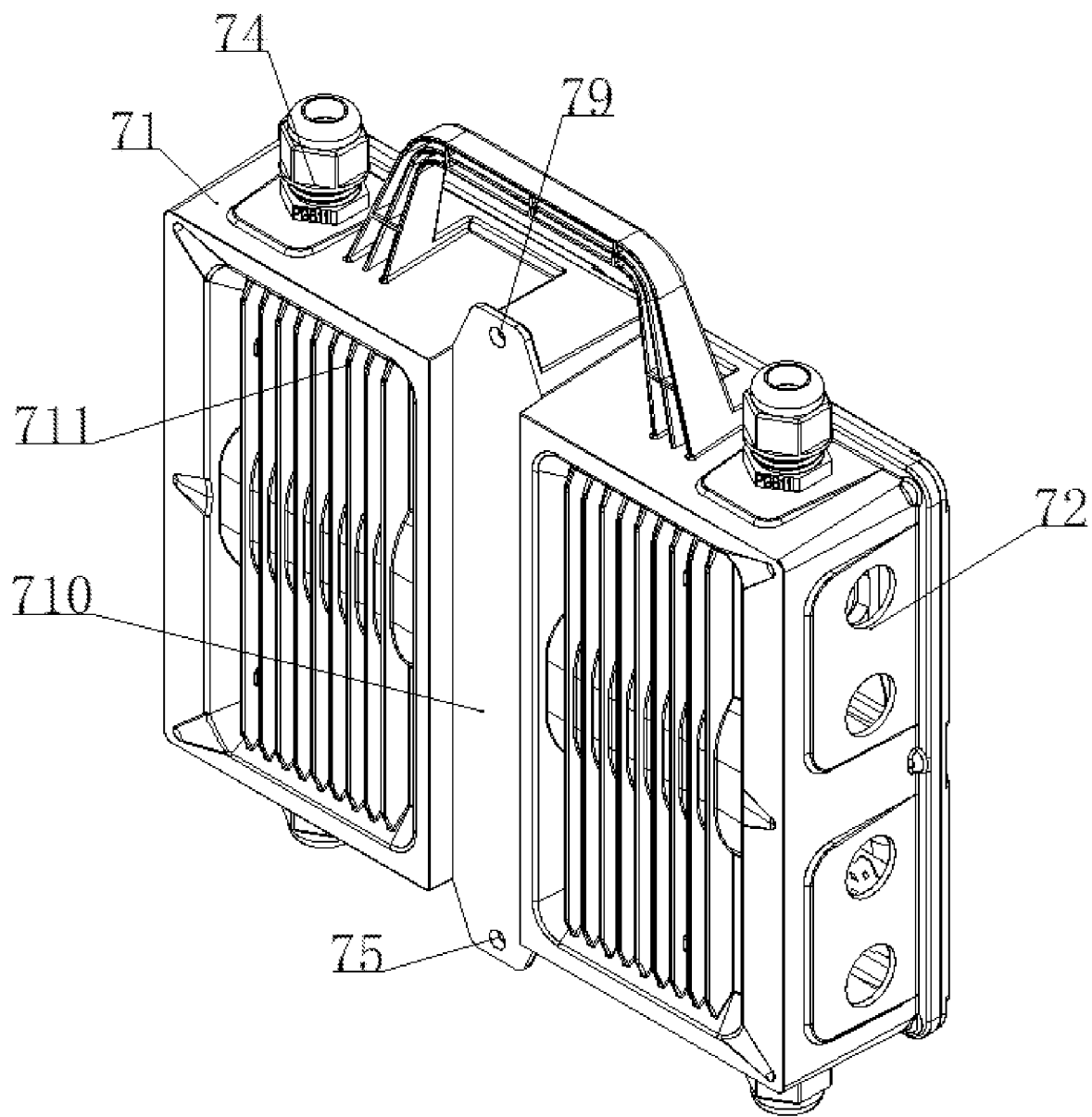
FIG. 9 is a schematic diagram illustrating an overall structure of a separate power control box in the present disclosure.
Figure 10:
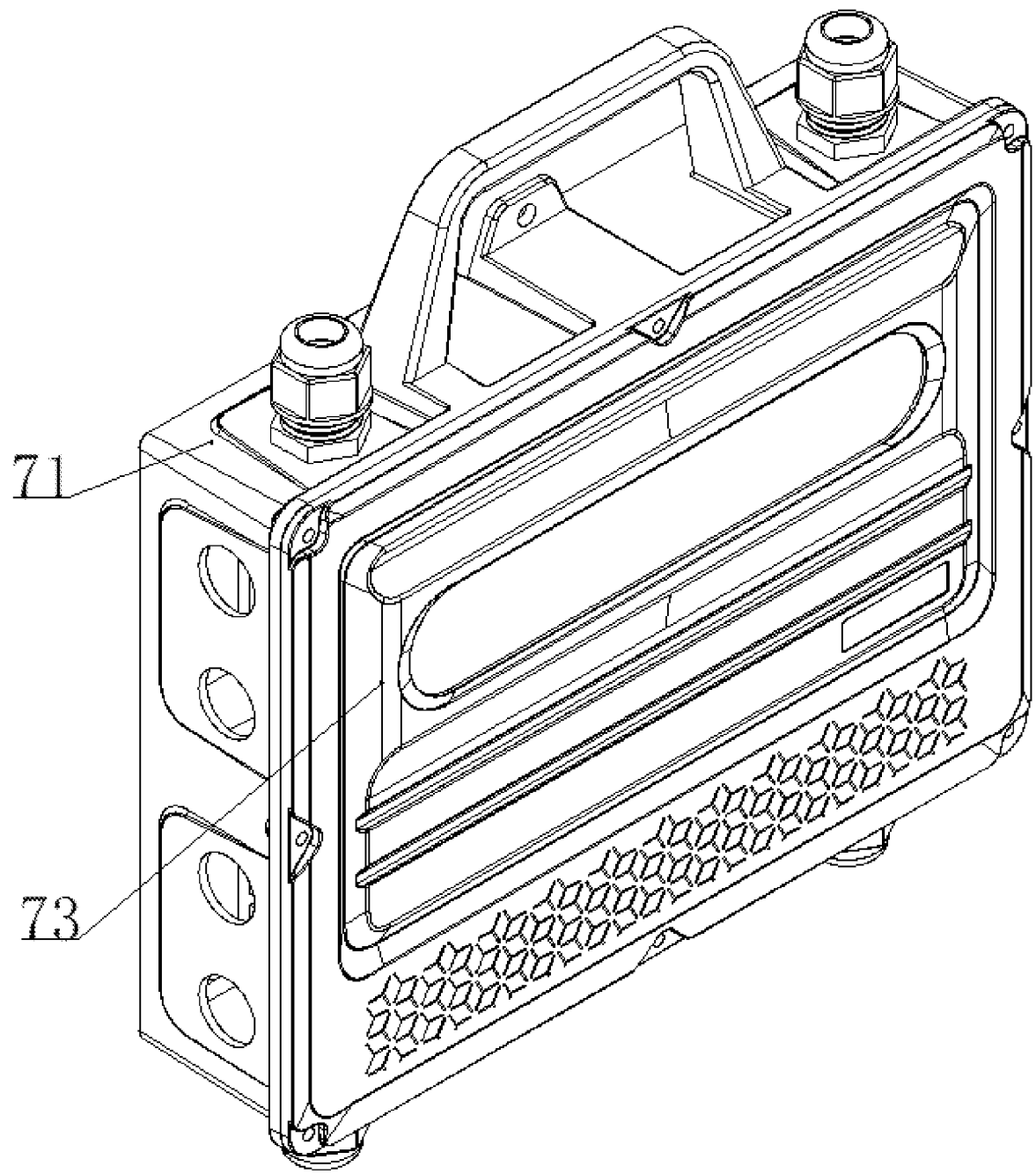
FIG. 10 is a schematic diagram illustrating another overall structure of the separate power control box in the present disclosure.
Figure 11:
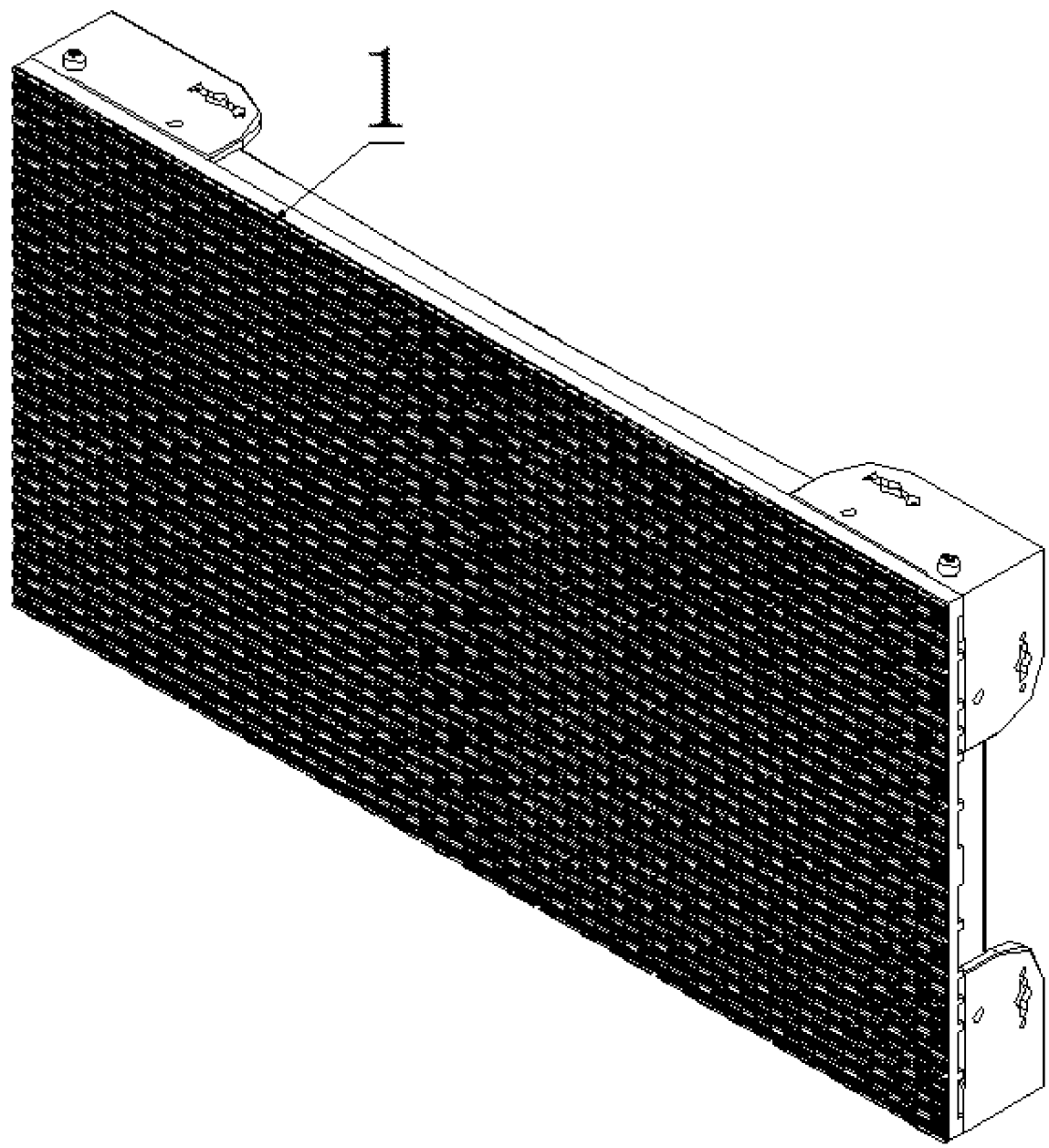
FIG. 11 is a schematic diagram illustrating an overall structure of an LED display in a second embodiment.
Figure 12:
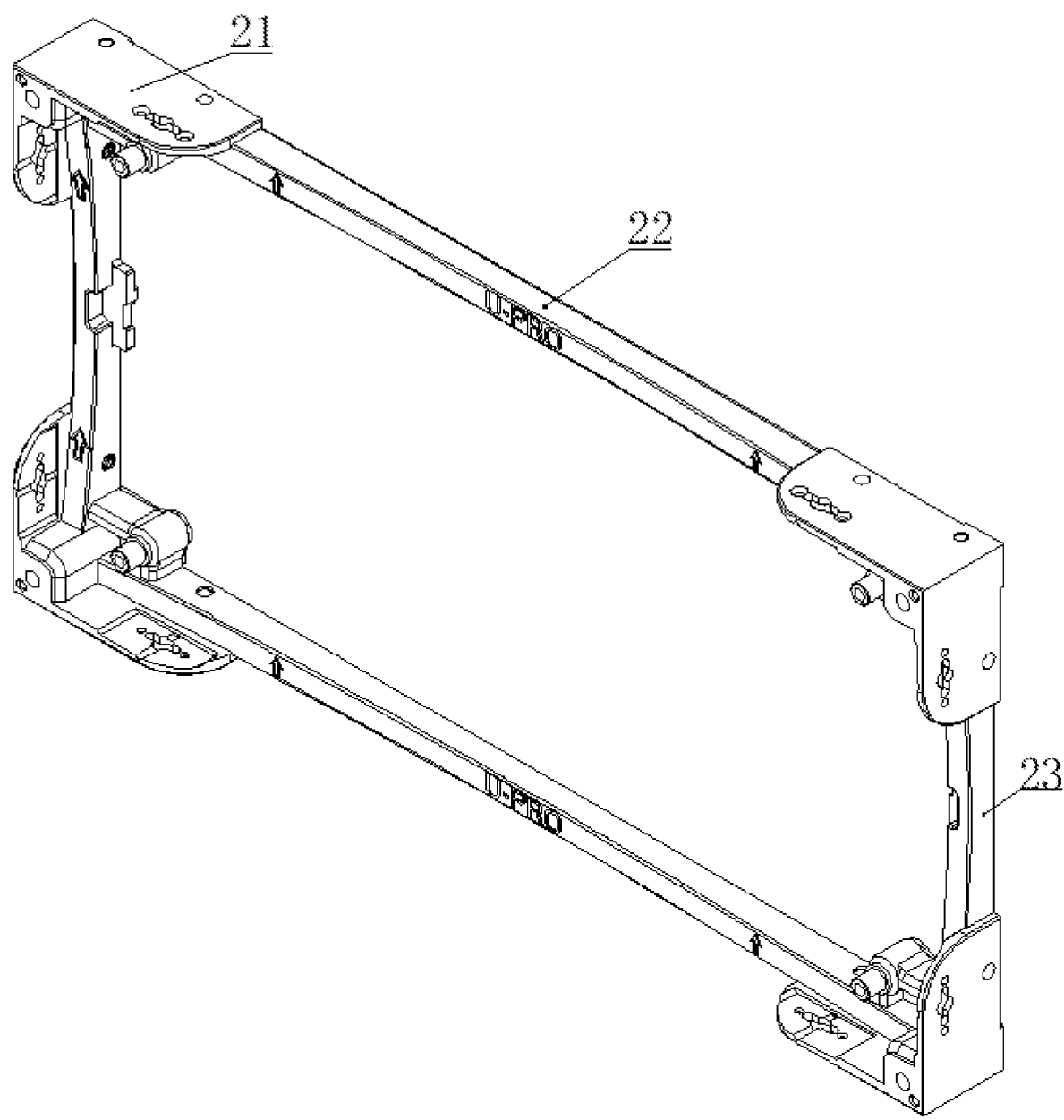
FIG. 12 is a schematic diagram illustrating a structure of a mounting frame in the second embodiment.
Figure 13:
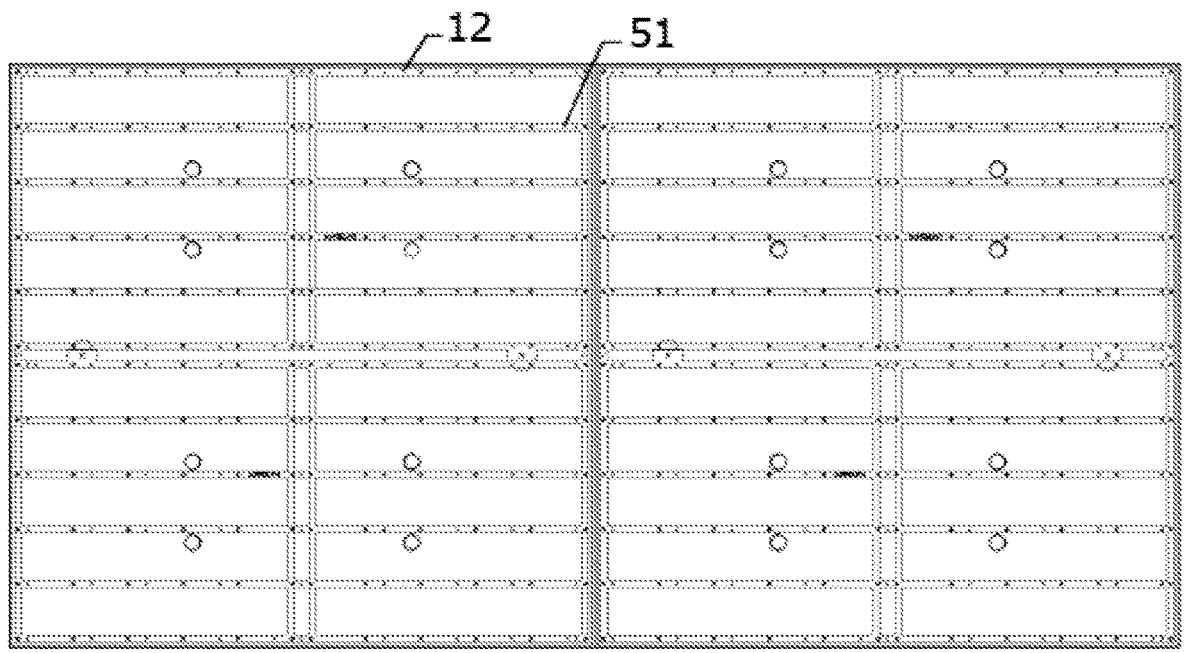
FIG. 13 is a schematic diagram illustrating a structure of an installation support in a third embodiment.

As shown in FIGS. 9-10, a separate power control box 3 is also included. The separate power control box 3 is electrically connected to the LED display panel 1, and the separate power control box 3 is connected to the mounting frame.

The separate power control box 3 includes a control box body 71, a heat dissipation window 711, a connection slot 710 and a cover plate 73. Herein, a power supply and a control card are provided inside the control box body 71, the power supply is electrically connected with an indicator light, the indicator light is configured to indicate whether the LED display panel 1 is energized, and both the power supply and the control card are electrically connected with the LED display panel 1. A cover plate 73 is detachably connected to a front side surface of the control box body 71, and a heat dissipation window 711 is placed on a rear side surface of the control box body 71, and the heat dissipation window 711 corresponds to the power supply, and the heat dissipation window 711 can dissipate heat generated during operation of the power supply to prevent the internal temperature of the control box body 71 from being too high and affecting the usage of the separate power control box 3. The connection slot 710 is placed in the middle of the rear side surface of the control box body 71 along the length direction, and the connection slot 710 extends along the height direction of the control box body 71.

A second sealing ring is provided between the control box body 71 and the cover plate 73, and the second sealing ring is fixedly connected to a stepped surface. The second sealing ring can seal the cover plate 73 with the control box body 71, to prevent a gap between the cover plate 73 and the control box body 71, thus preventing water from entering the control box body 71.

Waterproof power connectors 74 are provided at both top and bottom of the control box body 71, and the control box body 71 is electrically connected to the LED display panel 1 through the waterproof power connectors 74.

The control box body 71 is equipped with signal output interfaces 72 on both left and right sides, and the signal output interface 72 is integrally formed and made of soft rubber material. Signal transmission between the control box body 71 and LED display panel 1 can be achieved through the signal output interface 72.

As shown in FIGS. 2-5, the rear side surface of the casing 13 is provided with an adapter box 16, and the adapter box 16 is provided with an adapter plate 15, and the adapter plate 15 is electrically connected to the LED lamp panel 17. A first sealing ring 14 is configured between the adapter box 16 and the casing 13, and the adapter plate 15 is electrically connected to the separate power control box 3.

The receiving slot includes a fourth stepped part 38. The fourth stepped part 38 is formed at the middle of the front side of the casing 13 along the length direction, and the fourth stepped part 38 extends along a height direction of the casing 13. A first stepped part 35 is provided on both left and right sides of the fourth stepped part 38, and a third stepped part 37 is provide at edges around the front side of the casing 13. A second stepped part 36 is provided on a side of the third stepped part 37 adjacent to the first stepped part 35, around the edges of the casing 13. Both the second stepped part 36 and the third stepped part 37 are configured around two said first stepped parts 35, and the second stepped part 36 is separated by the fourth stepped part 38. A front side surface of the first stepped part 35, a front side surface of the second stepped part 36, a front side surface of the fourth stepped part 38 and a front side surface of the third stepped part 37 are arranged in sequence from back to front.

A plurality of the installation supports 12 are connected to the first stepped part 35, the rear side surface of the installation supports 12 is attached to the front side surface of the first stepped part 35, the front side surface of the installation supports 12 is coplanar with the front side surface of the second stepped part 36, a plurality of the LED lamp panels 17 are mounted on the front side surface of the plurality of installation supports 12, and the rear side surface of the plurality of LED lamp panels 17 is connected to the front side surface of the second stepped part 36. The front side surface of the LED lamp panel 17 is coplanar with the front side surface of the fourth stepped part 38. The rear side surface of the lamp panel mask 11 is connected to the front side surface of the third stepped part 37. The waterproof adhesive layer 110 is provided on the fourth stepped part 38 and the plurality of LED lamp panels 17. The rear side surface of the waterproof adhesive layer 110 is connected to the front side surface of the LED lamp panel 17 and the front side surface of the fourth stepped part 38. The front side surface of the waterproof adhesive layer 110 is connected to the rear side surface of the lamp panel mask 11.

The casing 13 includes a plurality of insertion slots 31 corresponding to an adapter plate 15, and the number of insertion slots 31 is consistent with the number of LED lamp panels 17.

The quantity ratio between the LED lamp panel 17, the installation support 12 and the lamp panel mask 11 is 1:2:4, and the number of LED lamp panel 17 may be even.

The installation support 12 is grid-structured and includes a number of horizontally extending support crossbars 51 and a number of vertically extending support longitudinal bars. The support crossbars 51 are evenly spaced in the height direction of the support longitudinal bars, and the support longitudinal bars are evenly spaced in the length direction of the support crossbars 51. The spacing of adjacent crossbars 51 can be configured in accordance with different lamp pitches of LED lamp panels 17. The plurality of installation supports 12 are arranged in a laterally (left-right) symmetrical manner. The length of the casing 13 in this embodiment is 609.6 mm, and the height of the casing 13 is 304.8 mm. The height of the support crossbar is 3.5 mm, and a distance between adjacent support crossbars 51 is 32.10 mm in the installation support 12, which is compatible with three types of LED lamp panels 17 with a lamp pitch of 6.35 mm, 7.8625 mm and 9.525 mm, respectively. It is certain that the distance between adjacent support crossbars 51 of the installation support 12 is not limited to 32.10 mm, but can also be variable to suit arrangement of LED lamp panels 17 with different lamp pitches.

The plurality of installation supports 12 are arranged in a left-right symmetrical manner with respect to the LED lamp panel 17.

The plurality of quick connection locks 18 are configured on the rear side surface of the casing 13, and quick connection parts 411 are configured on opposite sides of the two first transversal support rods 41. The quick connection locks 18 can be combined with the quick connection part 411 to secure the casing to the mounting frame.

In the present embodiment, there are four LED display panels 1. The four LED display panels 1 are configured on the left and right sides of the support pole 44, and a second connection part 412 are provided on both the left and right sides of the support pole 44 to match the quick connection lock 18. The present disclosure shall not be limited to include four LED display panels 1, and it is also possible that at least one LED display panel(s) 1 is included. The size of the mounting frame can be adjusted according to the number of LED display panels 1.

The quick connection lock 18, quick connection part 411 and second connection part 412 may have similar configurations as disclosed by related arts, as long as they can facilitate operations of quickly making the case 13 connected to or separated from the mounting frame.

A second embodiment is described as follows.

The second embodiment is similar with the first embodiment, while there is a difference that in this embodiment, the mounting frame includes a transversal support rod 22 in transvers configuration, a longitudinal support rod 23 in longitudinal configuration and an L-shaped connection plate 21, wherein two transversal support rods 22 and two longitudinal support rods 23 are head-tail connected via the L-shaped connection plate. The L-shaped connection plate 21 is configured outside of the transversal support rod 22 and the longitudinal support rod 23.

In this solution, the mounting frame has a one-to-one correspondence with the LED display panel 1, and when it is needed to combine a plurality of LED display panels 1, adjacent mounting frames can be connected via bolts or quick connection devices. The quick connection device may have an existing structure, as long as it can realize fast fixing of adjacent mounting frames.

A third embodiment is described as follows.

The third embodiment is similar with the first embodiment, while there is a difference that in this embodiment, the length of the casing 13 is 609.6 mm, and the height of the casing 13 is 304.8 mm, a distance between adjacent support crossbars 51 of the installation support 12 is 25.07 mm, and the height of the support crossbar 51 is 3.5 mm. Installation support 12 of this type can be adopted to the install LED lamp panel 17 with a lamp pitch of 4.875 mm.

In the description of the present disclosure, it should be understood that, terms such as "first" and "second" are used herein for purposes of description and are not intended to indicate or imply relative importance or significance or to imply the number of indicated technical features. Thus, the feature defined with "first" and "second" may comprise one or more of the features. In the description of the present disclosure, the term "a plurality of" means two or more than two, unless specified otherwise.

In the present disclosure, unless specified or limited otherwise, the terms "mounted", "connected", "coupled", "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on", "above", or "on top of" a second feature may include an embodiment in which the first feature is right or obliquely "on", "above", or "on top of" the second feature, or just means that the first feature is at a height higher than that of the second feature; while a first feature "below", "under", or "on bottom of" a second feature may include an embodiment in which the first feature is right or obliquely "below", "under" or "on bottom of" the second feature, or just means that the first feature is at a height lower than that of the second feature.

In the description of the present specification, the terms "an embodiment", "some embodiments", "an example", "a specific example", "some examples" or the like mean that a particular feature, structure, material, or characteristic described in connection with the embodiment or example is included in at least one embodiment or example of the present disclosure. In the specification, the appearances of the above-mentioned terms are not necessarily referring to the same embodiment or example. Furthermore, the particular features, structures, materials, or characteristics described can be combined in any suitable manner in one or more embodiments or examples.

Although embodiments of the present disclosure have been shown and illustrated, it shall be understood by those skilled in the art that the above embodiments are exemplary and cannot be construed to limit the present disclosure; various changes, modifications, alternatives, and variants can be made in the embodiments without departing from the scope of the present disclosure.

What is claimed is:

1. An LED display, comprising a mounting frame and an LED display panel mounted on a front side surface of the mounting frame;

the LED display panel comprising a casing, an installation support, an LED lamp panel, a waterproof adhesive layer and a lamp panel mask arranged in sequence from back to front; wherein, a receiving slot is formed in a front part of the casing, for receiving the installation support, the LED lamp panel, the waterproof adhesive layer and the lamp panel mask;

a rear side surface of the installation support is attached to a front side surface of the casing, and a front side surface of the installation support is attached to a rear side surface of the LED lamp panel; and a rear side surface of the waterproof adhesive layer is attached to a front side surface of the LED lamp panel, and a front side surface of the waterproof adhesive layer is attached to a rear side surface of the lamp panel mask;

wherein the mounting frame comprises first transversal support rods extending transversely, first longitudinal support rods extending longitudinally and a connection block, the connection block comprising two connection surfaces, with an angle of 90° between the two connection surfaces, two said first transversal support rods and two said first longitudinal support rods are head-tail connected, one connection surface of the connection block is connected to the first transversal support rods, and the other connection surface of the connection block is connected to the first longitudinal support rods, with at least one support pole provided between the two said first transversal support rods and extending along a length direction, the support pole comprising two first control box connection holes.

2. The LED display as claimed in claim 1, comprising at least two protection doors on the first transversal support rods, the protection doors configured on two opposite sides of the support pole, the protection doors comprising a plurality of heat dissipation holes and further comprising locking parts at four corners, the first transversal support rods comprising a connection part, the locking part matching with the connection part.

3. The LED display as claimed in claim 2, further comprising a separate power control box, the separate power control box being electrically connected to the LED display panel and being connected to the mounting frame;

the separate power control box comprising a control box body, a heat dissipation window, a connection slot and a cover plate, wherein, the control box body contains a power supply and a control card, the power supply and the control card are electrically connected to the LED display panel; the cover plate is detachably connected to a front side surface of the control box body, the heat dissipation window is configured on a rear side surface of the control box body, the heat dissipation window is in correspondence with the power supply; the connection slot is configured in a middle of the rear side surface of the control box body along the length direction, the connection slot is configured along a height direction of the control box body; and the control box body comprises a first connection hole on the top, with the first connection hole in correspondence with the connection slot.

4. The LED display as claimed in claim 3, wherein, the connection slot matches with the support pole; a projection is formed at a bottom of the control box body, with a second connection hole formed at a bottom of the projection, and the second connection hole and the first connection hole are respectively bolted to the two first control box connection holes.

5. The LED display as claimed in claim 1, further comprising a separate power control box, the separate power control box being electrically connected to the LED display panel and being connected to the mounting frame;

the separate power control box comprising a control box body, a heat dissipation window, a connection slot and a cover plate, wherein, the control box body contains a power supply and a control card, the power supply and the control card are electrically connected to the LED display panel; the cover plate is detachably connected to a front side surface of the control box body, the heat dissipation window is configured on a rear side surface of the control box body, the heat dissipation window is in correspondence with the power supply; the connection slot is configured in a middle of the rear side surface of the control box body along the length direction, the connection slot is configured along a height direction of the control box body; and the control box body comprises a first connection hole on the top, with the first connection hole in correspondence with the connection slot.

6. The LED display as claimed in claim 5, wherein, the connection slot matches with the support pole; a projection is formed at a bottom of the control box body, with a second connection hole formed at a bottom of the projection, and the second connection hole and the first connection hole are respectively bolted to the two first control box connection holes.

7. The LED display as claimed in claim 1, wherein, the mounting frame comprises transversal support rods configured transversely, longitudinal support rods longitudinally configured and an L-shaped connection plate; two said transversal support rods and two said longitudinal support rods are head-tail connected via the L-shaped connection plate, with the L-shaped connection plate placed outside of the transversal support rods and the longitudinal support rods.

8. The LED display as claimed in claim 1, further comprising an adapter plate provided on the rear side surface of the casing, with the adapter plate being electrically connected to the LED lamp panel and to a separate power control box;

the receiving slot comprising a fourth stepped part which is formed in a middle of a front side of the casing along a length direction, and extends along a height direction of the casing; wherein, a first stepped part is provided on two opposite sides of the fourth stepped part, a third stepped part is provide at edges around the front side of the casing, and a second stepped part is provided on a side of the third stepped part adjacent to the first stepped part, along the edges around the casing, with both the second stepped part and the third stepped part configured around two said first stepped parts 35 and the second stepped part being separated by the fourth stepped part; and a front side surface of the first stepped part, a front side surface of the second stepped part, a front side surface of the fourth stepped part and a front side surface of the third stepped part are configured in sequence from back to front.

9. The LED display as claimed in claim 8, wherein, a plurality of the installation supports are connected to the first stepped part, the rear side surface of the installation supports is attached to the front side surface of the first stepped part, the front side surface of the installation supports is coplanar with the front side surface of the second stepped part, and the rear side surface of a plurality of the LED lamp panels is connected to the front side surface of the second stepped part; the front side surface of the LED lamp panel is coplanar with the front side surface of the fourth stepped part; the rear side surface of the lamp panel mask is connected to the front side surface of the third stepped part; and the waterproof adhesive layer is provided on the fourth stepped part and the plurality of LED lamp panels, with the rear side surface of the waterproof adhesive layer connected to the front side surface of the LED lamp panel and the front side surface of the fourth stepped part, and the front side surface of the waterproof adhesive layer connected to the rear side surface of the lamp panel mask.

10. The LED display as claimed in claim 1, wherein, a quantity ratio of the LED lamp panel, the installation support and the lamp panel mask is 1:2:4.

11. The LED display as claimed in claim 1, wherein, the installation support is grid-structured, comprising a number of horizontally extending support crossbars and a number of vertically extending support longitudinal bars; the support crossbars are evenly spaced in a height direction of the support longitudinal bars, and the support longitudinal bars are evenly spaced in a length direction of the support crossbars; a plurality of installation supports are configured in a laterally symmetrical manner with respect to the LED lamp panel.

* * * * *